(12) United States Patent  (10) Patent No.: US 7,696,805 B2
Thorp et al.  (45) Date of Patent: *Apr. 13, 2010

(54) LEVEL SHIFTER CIRCUIT INCORPORATING TRANSISTOR SNAP-BACK PROTECTION

(75) Inventors: Tyler J. Thorp, Sunnyvale, CA (US); Luca G. Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 137 days.

This patent is subject to a terminal disclaimer.

(21) Appl. No.: 11/695,013

(22) Filed: Mar. 31, 2007

(65) Prior Publication Data

US 2008/0238523 A1    Oct. 2, 2008

(51) Int. Cl.
    H03L 5/00 (2006.01)
(52) U.S. Cl. .......................... 327/333; 326/68
(58) Field of Classification Search ................ 326/63, 326/68, 80, 81; 327/333
    See application file for complete search history.

(56) References Cited

U.S. PATENT DOCUMENTS

| | | | |
|---|---|---|---|
| 4,161,663 A | 7/1979 | Martinez | |
| 5,406,141 A * | 4/1995 | Yero et al. | ............... 326/68 |
| 5,450,357 A | 9/1995 | Coffman | |
| 5,498,991 A | 3/1996 | Tanoi | |
| 5,539,334 A | 7/1996 | Clapp, III et al. | |
| 5,619,150 A | 4/1997 | Briner | |
| 5,698,993 A | 12/1997 | Chow | |
| 5,723,986 A | 3/1998 | Nakashiro et al. | |
| 5,723,987 A | 3/1998 | Ronen | |
| 5,781,026 A | 7/1998 | Chow | |
| 5,821,800 A | 10/1998 | Le et al. | |
| 5,959,902 A | 9/1999 | Fontana et al. | |
| 5,969,542 A | 10/1999 | Maley et al. | |
| 6,054,888 A | 4/2000 | Maley | |
| 6,087,880 A | 7/2000 | Takagi | |
| 6,240,027 B1 | 5/2001 | Lee et al. | |

(Continued)

FOREIGN PATENT DOCUMENTS

EP        0935346 B1    3/2002

(Continued)

OTHER PUBLICATIONS

International Search Report and Written Opinion, mailed Sep. 23, 2008 for PCT/US2008/058933, 7 pages.

(Continued)

*Primary Examiner*—Quan Tra
(74) *Attorney, Agent, or Firm*—Zagorin O'Brien Graham LLP (57) ABSTRACT

Level shift circuits are disclosed for level shifting an input signal corresponding to a first voltage domain, to generate a pair of complementary output signals corresponding to a second, higher-voltage domain. Snap-back sensitive devices in a discharge circuit for a high voltage output node are protected, irrespective of the loading on the output node, and without requiring precise transistor sizing as a function of the output loading. The snap-back sensitive devices are protected by a voltage shifter circuit in series with the sensitive devices, to limit the voltage across the sensitive devices, even for a high capacitance output node at its highest output voltage. The voltage shifter circuit is then bypassed to provide for an output low level that fully reaches the lower power supply rail.

23 Claims, 4 Drawing Sheets

U.S. PATENT DOCUMENTS

| | | |
|---|---|---|
| 6,329,841 B1 | 12/2001 | Kim |
| 6,344,764 B2 * | 2/2002 | Tanzawa .................... 326/68 |
| 6,377,502 B1 | 4/2002 | Honda et al. |
| 6,433,582 B2 | 8/2002 | Hirano |
| 6,437,627 B1 | 8/2002 | Tran et al. |
| 6,445,210 B2 | 9/2002 | Nojiri |
| 6,476,637 B1 | 11/2002 | Brownlow et al. |
| 6,670,939 B2 | 12/2003 | Yang et al. |
| 6,696,878 B1 | 2/2004 | Haskin |
| 6,842,043 B1 | 1/2005 | Nguyen et al. |
| 6,924,689 B2 | 8/2005 | Randazzo et al. |
| 6,963,226 B2 | 11/2005 | Chiang |
| 7,151,400 B2 | 12/2006 | Chen |
| 7,164,291 B2 * | 1/2007 | Mair et al. .................... 326/83 |
| 7,233,193 B2 | 6/2007 | Kim |
| 7,245,152 B2 | 7/2007 | Wich |
| 7,257,031 B2 | 8/2007 | Darrer |
| 2008/0024188 A1 * | 1/2008 | Chou et al. ................ 327/333 |

FOREIGN PATENT DOCUMENTS

| | | |
|---|---|---|
| JP | 09018328 A | 1/1997 |
| JP | 2006295252 A | 10/2006 |

OTHER PUBLICATIONS

U.S. Appl. No. 11/695,011, filed Mar. 31, 2007 and naming as inventors Tyler J. Thorp and Luca G. Fasoli.

* cited by examiner

LEVEL SHIFTER CIRCUIT INCORPORATING TRANSISTOR SNAP-BACK PROTECTION

CROSS-REFERENCE TO RELATED APPLICATION(S)

This application is related to the following co-pending U.S. Application(s), each of which is incorporated by reference herein in its entirety:

U.S. application Ser. No. 11/695,011 entitled "Method for Incorporating Transistor Snap-Back Protection in a Level Shifter Circuit" by Tyler J. Thorp and Luca G. Fasoli, filed on even date herewith.

BACKGROUND

1. Field of the Invention

The present invention relates to level shifting circuits for generating a high voltage domain output signal responsive to a low voltage domain input signal.

2. Description of the Related Art

Level shifting circuits are commonly used to convert a signal from a low voltage domain to a high voltage domain. For example, a logic signal may be generated by circuitry which is powered by a low-voltage power supply voltage, such as VDD (e.g., 1.5 volts), and thus have output levels generally corresponding to VDD and ground. However many circuits, such as programmable memory devices, utilize higher voltages for internal signals in programming and erase modes than in a read mode. Frequently such devices use an internal power supply voltage from 3-10 volts or higher, which may be known as VPP. Consequently, it is useful to generate level shifted "versions" of these low-level logic signals, which level shifted signals have output levels of VPP and ground, to provide appropriate voltages on various switched circuit nodes, especially during programming and erase modes of operation.

As semiconductor devices have become smaller, the voltage which may be safely applied across various devices has decreased. For example, the maximum voltage that may be safely applied from drain to source terminals of a non-conducting N-channel MOSFET transistor (i.e., an "off" NMOS transistor) is frequently known as a breakdown voltage. However, when such a transistor is conducting, the maximum voltage that may be safely applied from drain to source terminals is frequently a lower voltage than the breakdown voltage. Such a voltage is known as the "snap back" voltage, which is named for the visual appearance of the transistor's I-V curve when subjected to such conditions.

Snap back concerns frequently limit the operating voltage achievable in a level shifting circuit, and may pose significant reliability concerns in such level shifting circuits. Snap back problems are more problematic in NMOS devices than in PMOS devices, because of the greater susceptibility of electrons being trapped in oxides and surface traps than the susceptibility for holes being trapped. Snap back can cause catastrophic failure of a device, and hence the failure of a circuit incorporating such a device. Consequently, snap back problems are more likely to arise in sub-circuits used to discharge a high voltage node, such as an output node of a level shifter circuit.

Figure 1:
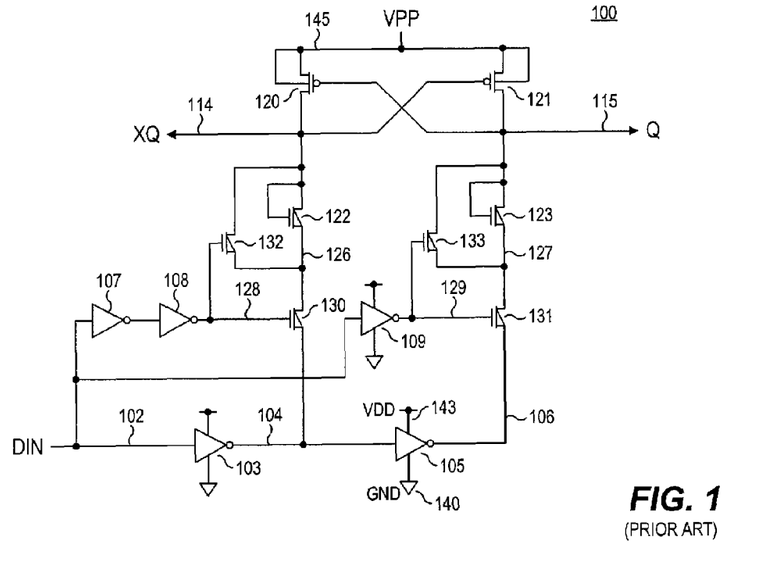
FIG. 1, labeled prior art, is a schematic diagram of a level shifter circuit.

Referring now to FIG. 1, a snapback protected level shifter 100 is shown. A logic signal DIN is conveyed on node 102, and is the input signal for this level shifter 100. This input signal need not correspond to a "data" signal, but can be any logic signal, such as an address signal, a decoded or pre-decoded address signal, a control signal, or any other logic signal generally having one of two logic states for a low-voltage domain as its signal levels. The inverters 103, 105, 107, 108, and 109 all belong to this low-voltage domain, being powered by VDD (node 143) and ground (node 140), and thus the signals generated on nodes 104, 106 128, and 129 are each "VDD-level" signals (i.e., having a "high" level of VDD, and a "low" level of ground). These low-voltage inverters 103, 105, 107, 108, and 109 are implemented with low-voltage transistors having a typical threshold voltage ($V_T$) of 300-600 mV, and which devices are not suitable to connection to high voltage nodes.

A second power supply VPP is conveyed on node 145. Such a power supply may be provided from an external source, or may be generated internally within the overall circuit (e.g., a FLASH memory device or other programmable memory device). Moreover, the voltage conveyed on the VPP node 145 may vary depending upon the mode of operation. For example, the magnitude of the VPP voltage in a read mode may be much lower (e.g., 3 volts) than in a write, programming, or erase mode. For the description that follows, we shall assume the VPP voltage to be a high voltage (e.g., 10 volts, such as for a programming mode) well above the snap back voltage for typical NMOS transistors.

The complementary XQ, Q output nodes 114, 115 are coupled to VPP by cross-coupled PMOS transistors 120, 121, and are coupled to ground by matching discharge circuits. The XQ output node 114 is discharged by native transistors 122, 130, 132, and the output pull down transistor within inverter 103, all as described below. Similarly, the Q output node 115 is discharged by native transistors 123, 131, 133, and the output pull down transistor within inverter 105. Such native transistors usually have a threshold voltage near zero volts.

High voltage NMOS devices may be available in some semiconductor processes. However, a suitable high voltage device for 10 volt operation likely requires a threshold voltage high enough (e.g., $V_T$=600-1200 mV) that a VDD level signal on its gate (e.g., as low as 1.2 volts) would barely turn on such a device, if at all.

To understand the operation of this circuit, assume initially that the DIN signal is high (i.e., VDD), and that consequently the Q output node 115 is also high (i.e., VPP) and that the XQ output node 114 is low (i.e., ground). Next assume that the DIN node transitions from a high to a low level (i.e., from VDD to ground). Clearly the intended operation is to bring the voltage of the Q output node 115 to ground, and to bring the voltage of the XQ output node 114 to VPP. With DIN at ground, node 128 is brought to ground, transistor 130 is turned off, and the XQ output node 114 is free to be driven high by PMOS transistor 120 when turned on by the decreasing voltage on the Q output node 115 that is coupled to the gate of transistor 120 (described in detail below).

With DIN at ground, node 106 is also driven to ground, and node 129 is driven high (i.e., VDD) by inverter 109. However, since transistor 131 is very sensitive to snap back, the rise time of node 129 is intentionally slowed so that the gate-to-source voltage of transistor 131 develops very slowly, and thus transistor 131 turns on very slowly, to thereby discharge node 127 (i.e., reducing the drain-to-source voltage on transistor 131) before the gate-to-source voltage of transistor 131 reaches a voltage that would cause a snap back condition. Such intentional slowing may be accomplished by using transistors in inverter 109 that have a longer electrical length than the usual "minimum length" transistors for a given semiconductor process. The level shift diode 123 is provided to decrease the voltage on node 127 to a lesser value than the voltage of the Q output node 115, to reduce the voltage otherwise impressed across transistor 131. As the voltage of node 129 continues to rise, and as the voltage of node 127 continues to fall, transistor 133 will eventually turn on, bypassing the level shift diode 123, and providing a discharge path from the Q output node 115, through transistor 133, transistor 131, and the inverter 105 pull down transistor, to ground. This discharge path is suitable to drive the Q output node 115 fully to ground, without resulting in a low level that "rides" above ground by a diode drop.

As the Q output 115 is being discharged, the PMOS pull-up transistor 121 initially remains fully turned on until the voltage of the Q output node 115 is reduced by at least a PMOS threshold voltage ($V_T$) so that PMOS transistor 120 turns on, charging up the complementary XQ output node 114, and turning off PMOS transistor 121 to thereby allow the discharge path to completely discharge the Q output node 115, and to achieve a quiescent state with no standby power dissipation. Such intentionally weakened pull down paths require that the corresponding pull up paths must also be weakened. In other words, if the discharge path is weakened, the pull-up path must also be weakened if the voltage on the output node is able to be reduced by at least a PMOS threshold voltage.

The weakened drive strength in both the charging (i.e., pull-up) path and the discharging (i.e., pull-down) path increases the delay through such a level shifter circuit, and thus reduces circuit performance. Moreover, the various transistors in the level shifter circuit must be sized for a given output load. As a result, no standard-sized level shifter circuit may be used with varying output capacitive loading without risking the reliability of the level shifter circuit.

Considerable efforts have been applied in the art to design around such snap back concerns, which sometimes results in circuits having unusually high complexity to accomplish what might seem like a simple logic structure. Nonetheless, improvements in such level shifter circuits are always beneficial.

SUMMARY

Improved level shift circuits are disclosed for level shifting an input signal corresponding to a first voltage domain, to generate an output signal or a pair of complementary output signals corresponding to a second higher-voltage domain. Snap-back sensitive devices in a discharge circuit for a high voltage output node are protected by a voltage shifter circuit in series with the sensitive devices, to limit the voltage across a sensitive device irrespective of the loading on the output node, and even for a high capacitance output node at the highest output voltage. This may be achieved without requiring precise transistor sizing, as a function of the output loading, to carefully control how quickly certain transistors are turned fully on. The voltage shifter circuit is then bypassed to provide for an output low level that fully reaches the lower power supply rail.

In one aspect the invention provides a level shifter circuit which, in an exemplary embodiment, includes: (a) first and second load devices for respectively coupling first and second complementary output nodes to a first voltage supply node; (b) first and second mutually exclusive driver circuits respectively for coupling the first and second output nodes to a second voltage supply node, each of the first and second driver circuits respectively comprising: (1) a voltage shifter circuit coupled between the respective output node and a respective intermediate node; (2) a bypass circuit coupled between the respective output node and the respective intermediate node; and (3) a switching circuit responsive to an input signal and coupled between the respective intermediate node and the second voltage supply node; (4) wherein the voltage shifter circuit provides a large enough voltage drop to ensure that, for a voltage of the respective output node equal to the highest voltage operably coupled to the first voltage supply node, and the switching circuit being fully enabled in response to the input signal, a voltage of the respective intermediate node does not exceed a maximum snap-back voltage of any device within the switching circuit.

In another aspect the invention provides a level shifter circuit which, in an exemplary embodiment, includes: (a) a first voltage supply node for operably receiving a first voltage; (b) a second voltage supply node for operably receiving a second voltage; (c) first and second load devices for respectively coupling first and second complementary output nodes to the first voltage; (d) first and second driver circuits for respectively coupling the first and second complementary output nodes to the second voltage, each of said first and second driver circuits respectively comprising: (1) voltage shifting means for providing on a respective intermediate node a voltage that, relative to a voltage of the respective output node, is level-shifted toward the second voltage by a certain magnitude; (2) switching means, responsive to an input signal, for coupling the respective intermediate node to the second voltage; and (3) bypass means for coupling the respective output node to the respective intermediate node, and thereby to the second voltage; (4) wherein the certain magnitude is chosen so that, for a respective output node at the first voltage and the switching means being fully enabled in response to the input signal, the level-shifted voltage of the respective intermediate node differs from the second voltage by no more than a maximum snap-back voltage of any device within the switching means.

In another aspect the invention provides a level shifter circuit which, in an exemplary embodiment, includes: (a) first and second voltage supply nodes; (b) first and second complementary output nodes; (c) first and second intermediate nodes; (d) first and second cross-coupled load devices respectively coupled between the first and second output nodes and the first voltage supply node; (e) first and second voltage shifter circuits respectively coupled between the first and second output nodes and the first and second intermediate nodes; (f) first and second bypass transistors respectively coupled between the first and second output nodes and the first and second intermediate nodes; and (g) first and second cross-coupled switch transistors respectively coupled between the first and second intermediate nodes and the second voltage supply node.

The invention in several aspects is particularly suitable for implementation within an integrated circuit, including those integrated circuits having a memory array, for methods for operating such circuits, for systems incorporating such circuits, and for computer readable media encodings of such circuits, all as described herein in greater detail and as set forth in the appended claims. A wide variety of such integrated circuits is specifically contemplated, particularly those incorporating programmable memory arrays, including those having a three-dimensional memory array formed above a substrate.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Moreover, the inventive aspects described herein are contemplated to be used alone or in combination. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED
EMBODIMENT(S)

Figure 2:
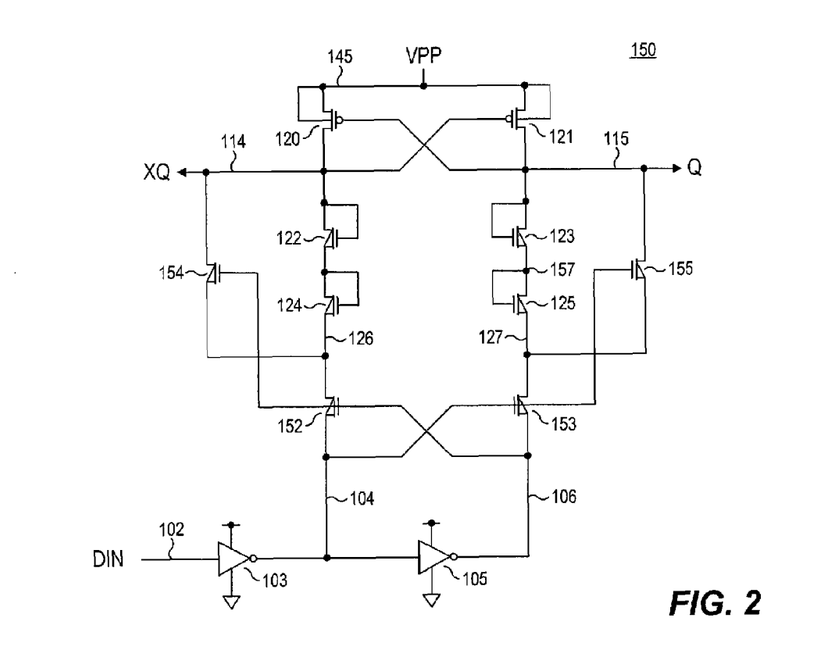
FIG. 2 is a schematic diagram of a level shifter circuit in accordance with some embodiments of the invention.

Referring now to FIG. 2, a level shifting circuit is shown that does not require intentionally weakened pull down paths, and yet is protected from snapback effects independent of output load. As before, a logic signal DIN is conveyed on node 102, and is inverted by low-voltage inverter 103 to generate the VDD-level control signal on node 104, which is inverted by low-voltage inverter 105 to generate the VDD-level control signal on node 106. The inverters 103, 105 may be viewed as belonging to the VDD voltage domain (i.e., the low voltage domain), and the input signal DIN conveyed on node 102 and the control signals conveyed on nodes 104, 106 may be viewed as VDD domain (i.e., low-voltage domain) signals having high and low levels respectively corresponding to VDD and ground.

The complementary XQ, Q output nodes 114, 115 are coupled to VPP by cross-coupled PMOS transistors 120, 121, and are coupled to ground by generally matching discharge circuits. The XQ output node 114 is discharged by native transistors 122, 124, 152, 154, and the low-voltage output pull-down transistor within inverter 103. Similarly, the Q output node 115 is discharged by native transistors 123, 125, 153, 155, and the low-voltage output pull-down transistor within inverter 105. The VPP voltage corresponds to a high voltage domain, and the output signals conveyed on nodes XQ, Q may be viewed as VPP domain (i.e., high-voltage domain) signals having high and low levels respectively corresponding to VPP and ground.

Again assume initially that the DIN signal is high, the Q output node 115 is high (i.e., VPP), and the XQ output node 114 is low (i.e., ground). When the DIN signal on node 102 transitions from a high to a low level, node 104 is driven to VDD, and node 106 is brought to ground. Thus, transistor 152 is turned off, and the XQ output node 114 is free to be driven high by PMOS transistor 120 when turned on by the decreasing voltage on the Q output node 115 that is coupled to the gate of transistor 120.

Transistor 153 is turned on when the rising voltage on node 104 exceeds the falling voltage on node 106. However, transistors 123, 125 form a voltage shifter circuit which reduces the maximum voltage on node 127, and transistor 153 may be turned on more quickly than the discharge transistor 131 in the level shifter circuit 100 shown in FIG. 1. As such, minimum length transistors may be used in the various transistors that drive the discharge path (e.g., inverters 103, 105), since no intentional delay need be introduced in turning on the discharge path.

As the voltage of node 127 falls, transistor 155 will eventually turn on, bypassing the level shift diodes 123, 125, and providing a discharge path from the Q output node 115, through transistor 155, transistor 153, and the inverter 105 pull down transistor, to ground. This discharge path is suitable to drive the Q output node 115 fully to ground.

The operation of the cross-coupled PMOS loads 120, 121 is as before described in FIG. 1. However, since the discharge path may be implemented as a much stronger path, the ratio effects become easier (i.e., the discharge path can more easily overcome the pull-up transistor 121 conduction and generate a –VT gate-to-source voltage on transistor 120). Since the pull down paths are more robust, the corresponding pull up paths may also be more robust. This provides a shorter delay through the level shifter circuit, and thus increases circuit performance. Moreover, the various transistors need not be precisely sized for a given output load, so that a standard-sized level shifter circuit may be used with varying output capacitive loading without risking the correct operation and reliability of the level shifter circuit.

Since the pull-down path may be sized to be strong, and since the low voltage devices are very strong, node 106 will pull down robustly to ground. As a result, the gate-to-source voltage of transistor 153 will be equal to VDD to allow the maximum current through transistor 153. Since all three pull down devices (i.e., transistors 123, 125, 153) are in saturation, the gate-to-source voltages for transistors 123 and 125 will also be equal to VDD (plus the additional VT due to body effect, and assuming all three transistors 123, 125, 131 are the same size). The bypass circuit (i.e., transistor 155) is not enabled until node 127 is below VDD, at which point the gate-to-source voltage of transistor 155 is around zero (i.e., its $V_T$). The voltage of the Q output node 115 at such time is therefore no higher than approximately 3*VDD, so the maximum $V_{DS}$ across transistor 155 when initially turned on is no higher than 2*VDD (although it is likely somewhat higher due to the body effect described above).

The voltage shifter circuit formed by transistors 123, 125 (and likewise by transistors 122, 124 in the XQ discharge path) may be implemented using a variety of other structures and devices. For example, PMOS diodes, high voltage NMOS or PMOS transistors, resistors, or any other suitable structure resulting in a voltage drop thereacross when a current flows therethrough, may alternatively be used. As would be the case with a resistor, the voltage drop need not be constant across the voltage shifter circuit. In other embodiments, each voltage shifter circuit may include other numbers of series diodes, such as one diode, three diodes, etc.

Significantly, the propagation delay through the level shifter circuit 150 shown in FIG. 2 is far less than the delay through the level shifter circuit 100 shown in FIG. 1. In addition, the level shifter circuit 150 has three fewer inverters than does the level shifter circuit 100. Yet, the level shifter circuit 150 need not be carefully scaled as a function of the capacitive load on its outputs. All of these are useful advantages of this circuit.

Figure 3:
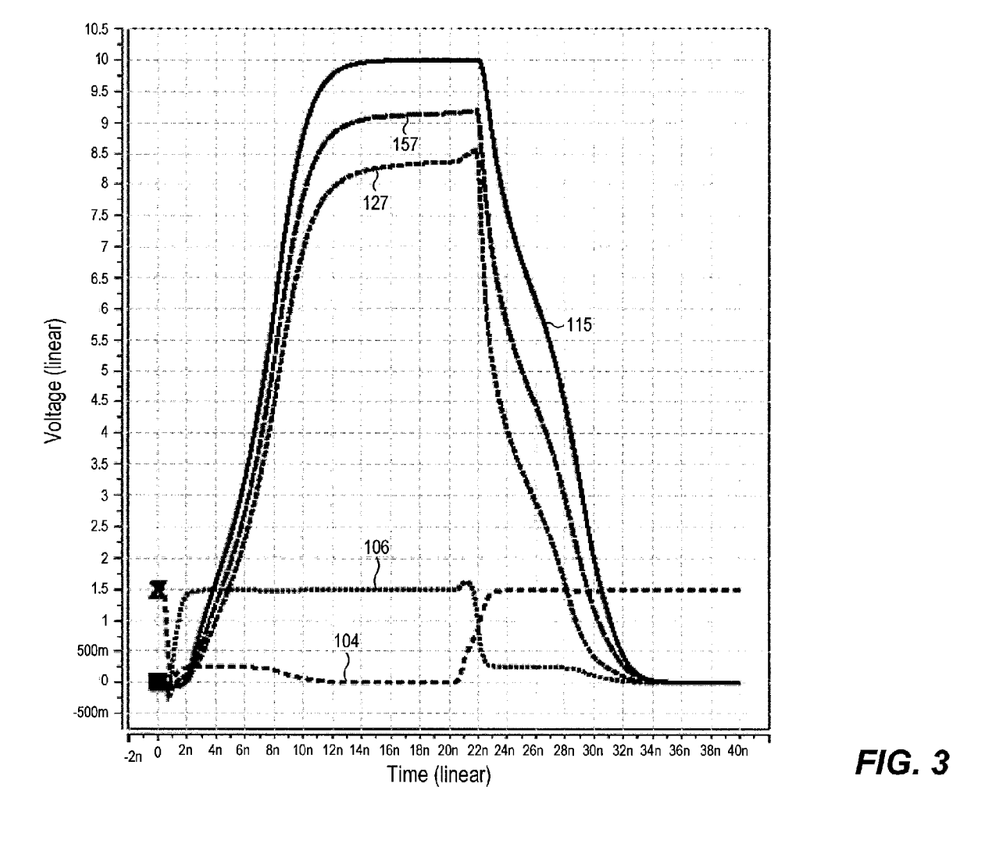
FIG. 3 is a waveform drawing illustrating switching behavior of the level shifter circuit depicted in FIG. 2.

FIG. 3 depicts exemplary waveforms for the level shifter circuit shown in FIG. 2, operating with a VDD voltage of 1.5 volts and a VPP voltage of 10 volts. This operation reflects a "fast PMOS/slow NMOS" process corner, which increases the difficulty of the NMOS transistors in the pull-down path overcoming the PMOS load transistor during switching, and is likely more susceptible to snap back effects than other process corners. Of note, transistor 153 turns on at approximate 22 ns, and develops a gate-to-source voltage approaching VDD (actually about 1200 mV) at about 22.8 ns. By that time, the voltage of node 127 has fallen to about 5.5 volts, and thus the drain-to-source voltage across transistor 153 has already dropped to below about 5.5 volts. For an exemplary semiconductor process, the nominal snap-back voltage ($V_{DS}$) for a native transistor is about 6.5 volts, assuming a $V_{GS}$ equal to VDD (e.g., 1.5 v). The voltage shifter circuit (transistors 123, 127) provides a large enough voltage drop to ensure that, for a voltage of the Q output node 115 equal to the VPP voltage, the voltage across the transistor 153 cannot exceed its maximum snap-back voltage.

Also of note, bypass transistor 155 turns on at approximate 28 ns when the voltage of node 127 drops below the voltage of node 104. By that time, the voltage of the Q output node 115 has fallen to about 4.5 volts, and thus the drain-to-source voltage across transistor 155 is about 3.0 volts. The voltage shifter circuit (transistors 123, 127) provides a small enough voltage drop to ensure that the voltage across the transistor 155, when it is turned on, cannot exceed its maximum snap-back voltage.

Figure 4:
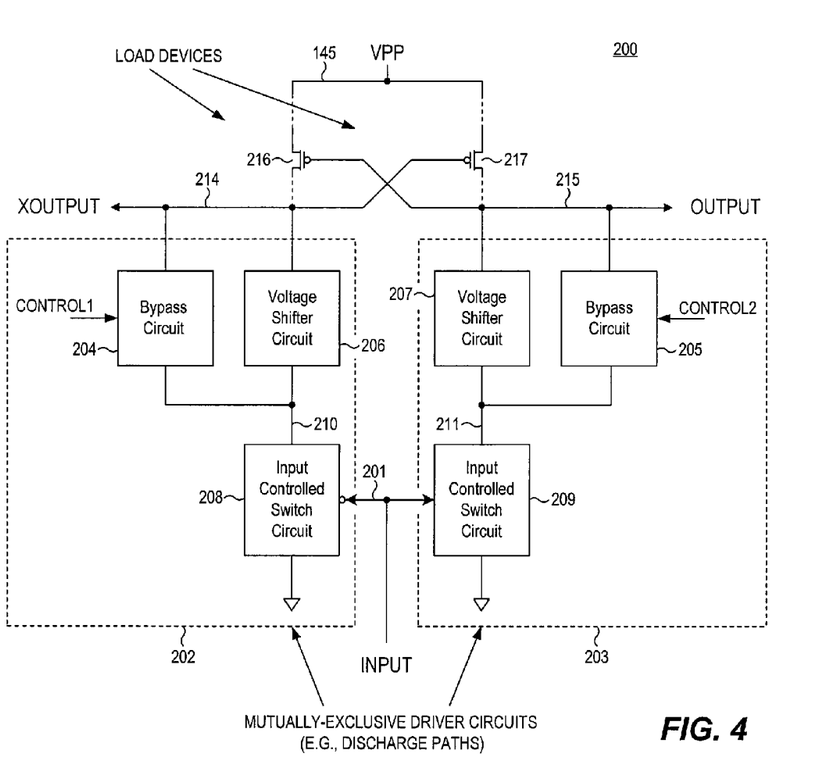
FIG. 4 is a block diagram of a level shifter circuit in accordance with some embodiments of the invention.

Referring now to FIG. 4, a block diagram 200 is depicted which represents certain level shifter embodiments in accordance with the invention. An input logic signal INPUT is conveyed on node 201, and is coupled to a pair of mutually-exclusive driver circuits (e.g., discharge paths) 202, 203. Complementary XOUTPUT, OUTPUT nodes 214, 215 are respectively coupled to VPP by cross-coupled load devices (here shown as PMOS transistors 216, 217), and are respectively coupled to ground by the mutually-exclusive driver circuits 202, 203. As implied by the dashed lines in both the source and drain connections to transistors 216, 217, other devices may be included in such load circuits (i.e., the transistors 216, 217 need not themselves be directly coupled to VPP and to nodes 214, 215).

The driver circuit 203 for the OUTPUT node 215 includes a voltage shifter circuit 207 in parallel with a bypass circuit 205, together coupled in series with an input-controlled switch circuit 209 which is enabled when the INPUT signal is high. Initially, the OUTPUT node 215 is discharged by current flow through the voltage shifter circuit 207 and through the input-controlled switch circuit 209. After the intermediate node 211 reaches a safe voltage, the bypass circuit 205 is enabled by a CONTROL2 signal, and the OUTPUT node 215 is discharged fully to ground by current flow through the bypass circuit 205 and the input-controlled switch circuit 209. When the voltage across the bypass circuit 205 decreases below the magnitude of the voltage across the voltage shifter circuit 207, current flow through the voltage shifter circuit 207 ceases, and the OUTPUT node 215 is discharged solely by the bypass circuit 205 and the input-controlled switch circuit 209.

The discharge path 202 for the complement XOUTOUT node 214 includes a voltage shifter circuit 206 in parallel with a bypass circuit 204 (responsive to a CONTROL1 signal), together coupled in series with an input-controlled switch circuit 208 which is enabled when the INPUT signal is low (note the inverting "bubble" on its input). Operation is identical to that of the discharge path 203, except for the obvious polarity change.

Figure 5:
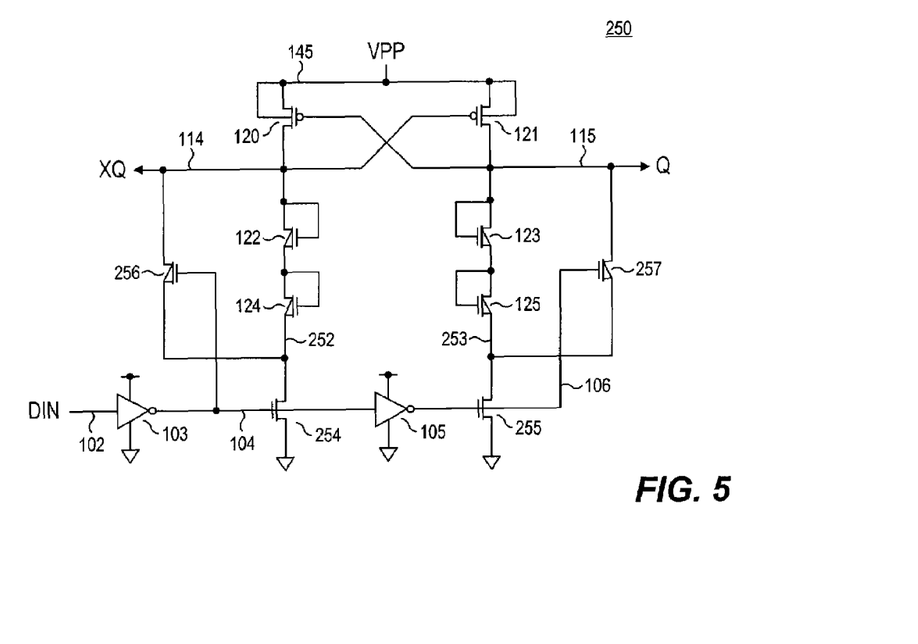
FIG. 5 is a schematic diagram of a level shifter circuit in accordance with some embodiments of the invention.

Referring now to FIG. 5, another level shifter circuit 250 is shown. The discharge path for the Q output node 115 includes a voltage shifter circuit (native transistors 123, 125), a bypass circuit (native transistor 257), and an input-controlled switch circuit (enhancement transistor 255, controlled by DIN through inverters 103, 105). In this case, the current path to ground does not flow through the inverter 105. The discharge path for the XQ output node 114 includes a voltage shifter circuit (native transistors 122, 124), a bypass circuit (native transistor 256), and an input-controlled switch circuit (enhancement transistor 254, controlled by DIN through inverter 103). As before, cross-coupled PMOS transistors 120, 121 serve as respective load devices for the XQ, Q output nodes 114, 115. This embodiment is useful when the lowest VDD voltage is sufficiently larger than the highest enhancement mode threshold voltage, so that a VDD-level signal on node 104 can always turn on transistor 254 (and likewise that a VDD-level signal on node 106 can always turn on transistor 255).

Figure 6:
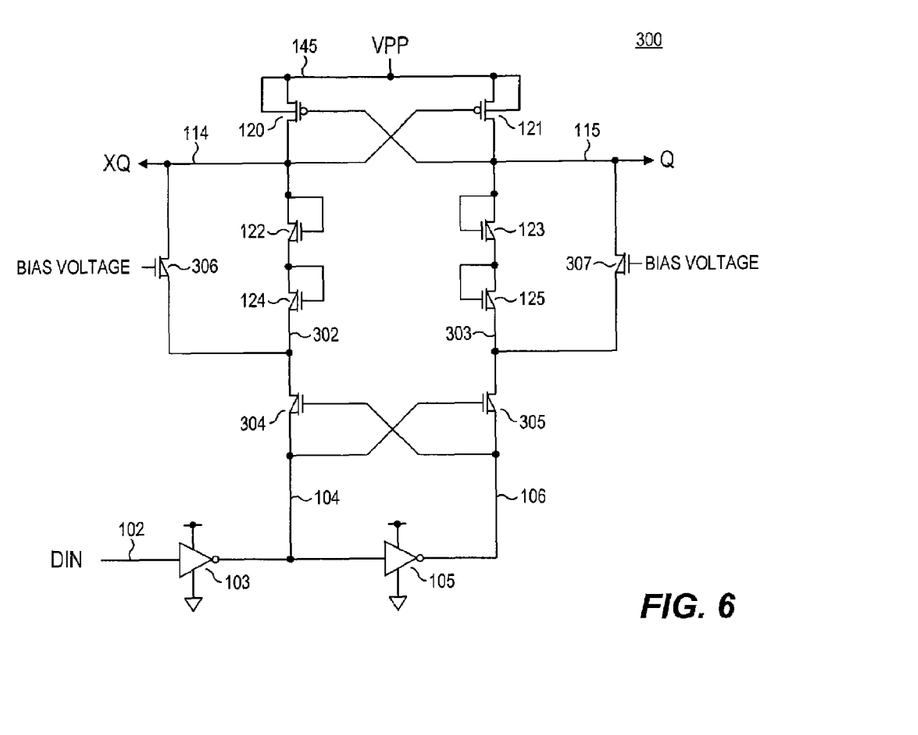
FIG. 6 is a schematic diagram of a level shifter circuit in accordance with some embodiments of the invention.

Referring now to FIG. 6, another level shifter circuit 300 is shown which is similar to that shown in FIG. 2, but with a bias voltage acting as a control voltage for the two bypass circuits. The discharge path for the Q output node 115 includes a voltage shifter circuit (transistors 123, 125), a bypass circuit (transistor 307 having a bias voltage coupled to its gate terminal), and an input-controlled switch circuit (transistor 305 and inverter 105). The discharge path for the XQ output node 114 includes a voltage shifter circuit (transistors 122, 124), a bypass circuit (transistor 306 having a bias voltage coupled to its gate terminal), and an input-controlled switch circuit (transistor 304 and inverter 103). As before, cross-coupled PMOS transistors 120, 121 serve as respective load devices for the XQ, Q output nodes 114, 115. The bias voltage coupled to the gates of transistors 306, 307 may be conveniently chosen to be VDD, or may be chosen to another higher or lower DC voltage to achieve bypass circuit turn-on at an appropriate voltage of the intermediate nodes 302, 303.

As used herein, a voltage supply node may be coupled to an externally generated source of voltage, or to an internally generated voltage by a circuit such as a voltage divider, a charge pump or other boosting circuit, a DC-DC converter circuit, or any other circuit for generating a source of voltage usable by other circuitry. Such nodes may also be described as power supply nodes. The ground reference node (i.e., VSS, "ground") may also be described as voltage supply node.

An output node such as the XQ, Q output nodes may be described herein as such for convenience but may, of course, be buffered further before actually being conveyed as an "output" to receiving circuitry. Moreover, both such XQ, Q output nodes (and/or any buffered versions thereof) need not be actually conveyed to any receiving circuitry, as there are many cases in which a level shifter circuit having a single polarity "output" may be desirable.

As used herein, coupled means either directly or indirectly. A transistor, switch circuit, or other switchable current path may be viewed as being fully enabled when one or more control signals controlling such device or structure have substantially reached their full enabling voltage or signal level. A voltage shifter circuit (sometimes referred to as a voltage shifter "block") may be implemented by any circuit structure providing a voltage drop thereacross for a given current flowing therethrough. Such a voltage drop may be substantially a constant voltage drop for any magnitude of current flow (i.e., a "perfect battery"), but such is not required. In practice, the magnitude of the voltage drop may decrease at low values of current, and may not be particularly constant voltage drop for any range of current. Examples include one or more diode-connected transistors in series, one or more physical diodes in series, one or more resistors in series, parallel combinations of such structures, etc. As used herein, two mutually-exclusive driver circuits (e.g., mutually-exclusive discharge paths) may include a brief overlap during which both such circuits are partially or fully conductive, but in steady state one of such circuits (e.g., paths) is conductive and the other is non-conductive.

As contemplated by certain embodiments described herein, an N-channel "native" transistor may be formed identically as a high-voltage NMOS transistor, but without receiving the channel implant that such high voltage devices receive to set the higher threshold voltage of such high voltage devices. In preferred embodiments, such native transistors have a nominal threshold voltage of 0 volts (e.g., $V_T$=−200 mV to +200 mV). The circuits described herein may be formed using well known semiconductor fabrication techniques.

While embodiments are described herein having positive voltages relative to a ground reference supply, other embodiments are specifically contemplated having negative voltages, or having both positive and negative voltages, relative to a ground reference supply. For example, the "dual" circuit for the described embodiments, achieved by interchanging NMOS and PMOS transistors and inverting the polarity of signal and power supply voltages, are also contemplated.

Regarding general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

A transistor may be conceptualized as having a control terminal which controls the flow of current between a first current handling terminal (or current carrying terminal) and a second current handling terminal. An appropriate condition on the control terminal causes a current to flow from/to the first current handling terminal and to/from the second current handling terminal (for typical operating voltages of the first and second current handling terminals). In a bipolar transistor, the first current handling terminal may be deemed the emitter, the control terminal deemed the base, and the second current handling terminal deemed the collector. An MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficiently high voltage on the gate (relative to the source voltage) causes a current to therefore flow from the drain to the source (provided the respective voltage of the drain and source are different). For an enhancement mode N-channel device, a positive gate-to-source voltage greater than the threshold voltage (including body effect) is sufficient. The source voltage referred to in N-channel MOS device equations merely refers to whichever current handling terminal has the lower voltage at any given point in time. For example, the "source" of the N-channel device of a bi-directional CMOS transfer gate depends on which side of the transfer gate is at the lower voltage. To reflect this symmetry of most N-channel MOS transistors, the control terminal may be deemed the gate, the first current handling terminal may be termed the "drain/source", and the second current handling terminal may be termed the "source/drain". Such a description is equally valid for a P-channel MOS transistor, since the polarity between drain and source voltages, and the direction of current flow between drain and source, is not implied by such terminology. Alternatively, one current handling terminal may arbitrarily deemed the "drain" and the other deemed the "source", with an implicit understanding that the two are not distinct, but interchangeable.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While circuits and physical structures are generally presumed, it is well recognized that in modern semiconductor design and fabrication, physical structures and circuits may be embodied in computer readable descriptive form suitable for use in subsequent design, test or fabrication activities as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods of operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. Moreover, the embodiments described above are specifically contemplated to be used alone as well as in various combinations. It is only the following claims, including all equivalents, that are intended to define the scope of this invention. Accordingly, other embodiments, variations, and improvements not described herein are not necessarily excluded from the scope of the invention.

What is claimed is:

1. A level shifter circuit comprising:
    first and second load devices for respectively coupling first and second complementary output nodes to a first voltage supply node;
    first and second mutually exclusive driver circuits respectively for coupling the first and second output nodes to a second voltage supply node, each of the first and second driver circuits respectively comprising:
        a voltage shifter circuit coupled between the respective output node and a respective intermediate node;
        a bypass circuit coupled between the respective output node and the respective intermediate node, said bypass circuit having a different circuit arrangement than the voltage shifter circuit; and
        a switching circuit responsive to an input signal and coupled between the respective intermediate node and the second voltage supply node;
        wherein the voltage shifter circuit provides a large enough voltage drop to ensure that, for a voltage of the respective output node equal to the highest voltage operably coupled to the first voltage supply node, and the switching circuit being fully enabled in response to the input signal, a voltage of the respective intermediate node does not exceed a maximum snap-back voltage of any device within the switching circuit; and
        wherein the bypass circuit, when conductive, provides a smaller voltage drop between the respective output node and the respective intermediate node than said voltage drop of the voltage shifter circuit;
    wherein the first switching circuit comprises a first switch transistor having a source terminal coupled to a first control node and having a gate terminal coupled to a second control node; and
    wherein the second switching circuit comprises a second switch transistor having a source terminal coupled to the second control node and having a gate terminal coupled to the first control node.

2. The circuit as recited in claim 1 wherein the first and second switching circuits comprise high voltage native transistors having a threshold voltage nominally around 0 volts.

3. The circuit as recited in claim 1 further comprising:
    a first inverter circuit responsive to the input signal, and having an output coupled to the first control node; and
    a second inverter circuit having an input coupled to the first control node, and having an output coupled to the second control node.

4. The circuit as recited in claim 3 wherein the first and second inverter circuits comprise low-voltage inverters coupled to a third voltage supply node and the second voltage supply node, said third voltage supply node for operably receiving a voltage substantially less than that received by the first voltage supply node.

5. The circuit as recited in claim 1 wherein the first and second voltage shifter circuits each provides a sufficiently low magnitude voltage drop to ensure that a voltage impressed across the first and second bypass circuits, when conductive, cannot exceed a maximum snap-back voltage of any device within the first and second bypass circuits.

6. A level shifter circuit comprising:
    a first voltage supply node for operably receiving a first voltage;
    a second voltage supply node for operably receiving a second voltage;
    first and second load devices for respectively coupling first and second complementary output nodes to the first voltage;
    first and second driver circuits for respectively coupling the first and second complementary output nodes to the second voltage, each of said first and second driver circuits respectively comprising:
        voltage shifting means for providing on a respective intermediate node a voltage that, relative to a voltage of the respective output node, is level-shifted toward the second voltage by a certain magnitude;
        switching means, responsive to an input signal, for coupling the respective intermediate node to the second voltage; and
        bypass means for coupling the respective output node to the respective intermediate node, and thereby to the second voltage;
        wherein the certain magnitude is chosen so that, for a respective output node at the first voltage and the switching means being fully enabled in response to the input signal, the level-shifted voltage of the respective intermediate node differs from the second voltage by no more than a maximum snap-back voltage of any device within the switching means; and
        wherein the bypass means, when conductive, provides a voltage drop between the respective output node and the respective intermediate node that is less than the certain magnitude;
    said level shifter circuit further comprising means for generating first and second complementary control signals responsive to the input signal, wherein the first switching means is responsive to the first and second control signals, and the second switching means is responsive to the first and second control signals.

7. The circuit as recited in claim 6 wherein the second voltage supply node comprises a ground reference node.

8. A level shifter circuit comprising:
a first voltage supply node for operably receiving a first voltage;
a second voltage supply node for operably receiving a second voltage;
first and second load devices for respectively coupling first and second complementary output nodes to the first voltage;
first and second driver circuits for respectively coupling the first and second complementary output nodes to the second voltage, each of said first and second driver circuits respectively comprising:
voltage shifting means for providing on a respective intermediate node a voltage that, relative to a voltage of the respective output node, is level-shifted toward the second voltage by a certain magnitude;
switching means, responsive to an input signal, for coupling the respective intermediate node to the second voltage; and
bypass means for coupling the respective output node to the respective intermediate node, and thereby to the second voltage;
wherein the certain magnitude is chosen so that, for a respective output node at the first voltage and the switching means being fully enabled in response to the input signal, the level-shifted voltage of the respective intermediate node differs from the second voltage by no more than a maximum snap-back voltage of any device within the switching means; and
wherein the bypass means, when conductive, provides a voltage drop between the respective output node and the respective intermediate node that is less than the certain magnitude;
said level shifter circuit further comprising means for generating first and second complementary control signals responsive to the input signal;
wherein the first switching means is responsive to the first control signal, and the second switching means is responsive to the second control signal; and
wherein the first bypass means is responsive to the second control signal, and the second bypass means is responsive to the first control signal.

9. The circuit as recited in claim 6 wherein the first and second voltage shifting means, the first and second bypass means, and the first and second switching means each comprises a high voltage native transistor having a threshold voltage nominally around 0 volts.

10. A level shifter circuit comprising:
first and second voltage supply nodes;
first and second complementary output nodes;
first and second intermediate nodes;
first and second cross-coupled load devices respectively coupled between the first and second output nodes and the first voltage supply node;
first and second voltage shifter circuits respectively coupled between the first and second output nodes and the first and second intermediate nodes;
first and second bypass transistors respectively coupled between the first and second output nodes and the first and second intermediate nodes; and
first and second cross-coupled switch transistors respectively coupled between the first and second intermediate nodes and the second voltage supply node;
wherein the first and second bypass transistors, when conductive, provide a smaller voltage drop between the respective output node and the respective intermediate node than the first and second voltage shifter circuits, when conductive, can provide.

11. The circuit as recited in claim 10 wherein the first and second switch transistors comprise high voltage native transistors having a threshold voltage nominally around 0 volts.

12. The circuit as recited in claim 10 further comprising a bias voltage node coupled to a respective gate terminal of the first and second bypass transistors.

13. The circuit as recited in claim 10 wherein:
a source terminal of the first switch transistor is coupled to a first control node, and further coupled to a gate terminal of the second switch transistor; and
a source terminal of the second switch transistor is coupled to a second control node, and further coupled to a gate terminal of the first switch transistor.

14. The circuit as recited in claim 13 further comprising:
a gate terminal of the first bypass transistor is coupled to the second control node; and
a gate terminal of the second bypass transistor is coupled to the first control node.

15. The circuit as recited in claim 13 further comprising:
a first inverter circuit responsive to an input signal, and having an output coupled to the first control node; and
a second inverter circuit having an input coupled to the first control node, and having an output coupled to the second control node.

16. The circuit as recited in claim 15 wherein:
a source terminal of the first switch transistor is coupled to the first control node; and
a source terminal of the second switch transistor is coupled to the second control node.

17. The circuit as recited in claim 16 wherein the first and second inverter circuits comprise low-voltage inverters coupled to a third voltage supply node and the second voltage supply node, said third voltage supply node for operably receiving a voltage less than that received by the first voltage supply node.

18. The circuit as recited in claim 10 wherein the first and second voltage shifter circuits each provides a sufficiently high magnitude voltage drop to ensure that, for a voltage of the first or second output node equal to the highest voltage operably coupled to the first voltage supply node, and the first or second switching circuit being fully enabled in response to the input signal, a voltage of the first and second intermediate nodes does not exceed a maximum snap-back voltage of the first and second switch transistor.

19. The circuit as recited in claim 18 wherein the first and second voltage shifter circuits each provides a sufficiently low magnitude voltage drop to ensure that a voltage impressed across the first and second bypass transistors, when conductive, cannot exceed a maximum snap-back voltage of the first and second bypass transistors.

20. The circuit as recited in claim 10 further comprising:
a first inverter circuit responsive to an input signal, having an output coupled to a first control node; and
a second inverter circuit having an input coupled to the first control node, having an output coupled to a second control node;
wherein a source terminal of the first switch transistor and a gate terminal of the second switch transistor are coupled to the first control node; and
wherein a source terminal of the second switch transistor and a gate terminal of the first switch transistor are coupled to the second control node.

21. The circuit as recited in claim 20 wherein:
a gate terminal of the first bypass transistor is coupled to the second control node;
a gate terminal of the second bypass transistor is coupled to the first control node; and
the first and second switch transistors comprise high voltage native transistors having a threshold voltage nominally around 0 volts.

22. The circuit as recited in claim 21 wherein the first and second voltage shifter circuits each respectively comprise a plurality of series connected high voltage native devices.

23. The circuit as recited in claim 10 embodied in a computer-readable media suitable for design, test, or manufacturing of an integrated circuit.

* * * * *